United States Patent [19]
Shibutani

[11] Patent Number: 6,087,756
[45] Date of Patent: Jul. 11, 2000

[54] SURFACE ACOUSTIC WAVE

[75] Inventor: Makoto Shibutani, Shiga-ken, Japan

[73] Assignee: Murata Manufacturing Co., Ltd., Japan

[21] Appl. No.: 09/129,065

[22] Filed: Aug. 4, 1998

[30] Foreign Application Priority Data

Aug. 11, 1997 [JP] Japan ................................. 9-216494

[51] Int. Cl.[7] .................................................. H01L 41/08
[52] U.S. Cl. ................................................... 310/313 B
[58] Field of Search ............................... 310/313 B, 365

[56] References Cited

U.S. PATENT DOCUMENTS 4,999,535  3/1991  Mariani et al. ..................... 310/313 B

FOREIGN PATENT DOCUMENTS

| | | |
|---|---|---|
| 59-232432 | 12/1984 | Japan . |
| 61-172362 | 8/1986 | Japan . |
| 62-174934 | 7/1987 | Japan . |
| 2 108 800 | 5/1983 | United Kingdom . |

*Primary Examiner*—Clayton LaBalle
*Assistant Examiner*—Peter Medley
*Attorney, Agent, or Firm*—Graham & James LLP

[57] ABSTRACT

A surface acoustic wave device substantially eliminates a stress caused by a curing shrinkage of an adhesive and substantially eliminates a strain in a case containing a surface acoustic wave element to prevent variation in characteristics of the surface acoustic wave device. In addition, a strength of joining of bonding wires provided in the surface acoustic wave device is improved to have an improved reliability. The surface acoustic wave element of the surface acoustic wave device is fixed on a case member via a soft adhesive and bonding electrodes of the surface acoustic wave element have a plurality of through holes. Ends of the bonding wires are wire-bonded to the bonding electrodes having the through holes formed therein.

14 Claims, 8 Drawing Sheets

ULTRASONIC WAVE AMPLITUDE

ULTRASONIC WAVE AMPLITUDE

SURFACE ACOUSTIC WAVE

BACKGROUND OF THE INVENTION

1. Field of the Invention

The present invention relates to a surface acoustic wave device such as a surface acoustic wave resonator or a surface acoustic wave filter adapted to make use of surface acoustic waves and, more particularly, to a surface acoustic wave device having an improved electrode structure including bonding wires.

2. Description of the Related Art

Ordinarily, in a surface acoustic wave device such as a surface acoustic wave resonator or a surface acoustic wave filter adapted to make use of surface acoustic waves, a surface acoustic wave element is provided in a case. FIG. 10 shows an example of such a surface acoustic wave device. In a surface acoustic wave device 51, a surface acoustic wave element 53 is provided in a case 52. The case 52 has a stacked structure in which a case member 52b and a frame member 52c each having a rectangular frame shape and made of an insulating ceramic and a lid member 52d are stacked on a case member 52a which is formed of an insulating ceramic such as alumina. The case member 52a has a recess formed in its upper surface, and the surface acoustic wave element 53 is fixed on the bottom surface of the recess 52d via an adhesive material 54. The adhesive material 54 is an epoxy adhesive or the like and has a high strength in a set state in order to reliably fix the surface acoustic wave element 53.

External electrodes 55a and 55b extending to outer side surfaces are disposed on an upper surface of the case member 52a. The external electrodes 55a and 55b are connected to electrodes 53a and 53b on the surface acoustic wave element 53 via bonding wires 56a and 56b.

In the surface acoustic wave device 51, the adhesive material 54 used to fix the surface acoustic wave element on the case member 52a contracts during setting so as to have a reduced size and coverage area. Such shrinkage during curing causes a stress which acts on the bonded surfaces of the case member 52a and the surface acoustic wave element 53 in a tensile direction, as indicated by the arrows in FIG. 11, resulting in a variation in a characteristic of the surface acoustic wave device 51.

Also, a strain may be caused in the case 52 by application of an external force or the like to the case 52. In such an event, a strain acts on the surface acoustic wave element 53 through the adhesive material 54. That is, if, for example, a bending strain is caused in the case 52, a tensile stress or compressive stress acts on the surface of the surface acoustic wave element 53, as indicated by the arrows in FIG. 10. It is possible that such tensile stress or compressive stress will cause a variation in a characteristic of the surface acoustic wave device 51.

That is, the conventional surface acoustic wave device 51 has the problem of a variation in characteristic due to curing shrinkage or stress in the adhesive material 54 or strain in the case 52. Such a stress can be caused not only at the time of manufacturing but also during use of the surface acoustic wave device 51. There is, therefore, a possibility of occurrence of a change in characteristic of the surface acoustic wave device during actual use.

In addition, the bonding strength of the bonding wires 56a and 56b joined to the electrodes 53a and 53b of the surface acoustic wave element 53 via ultrasonic bonding is often insufficient to provide a reliable connection therebetween. Therefore, as shown in FIG. 12, the method of forming an electrode layer 53c of Cr and an electrode 53d of Au so as to be reliably joinable to the bonding wire on the electrode portion of the surface acoustic wave element 53 to which the bonding wire 56a is to be joined, and the method of increasing the film thickness of the electrode portion to which the bonding wire 56a is joined, as shown in FIG. 13, have been tried. Each of these methods, however, increases the manufacturing cost because the number of electrode forming steps is increased.

SUMMARY OF THE INVENTION

To overcome the problems described above, the preferred embodiments of the present invention provide a surface acoustic wave device in which a stress caused by curing shrinkage of an adhesive or a strain in the case does not cause a variation in the characteristics of the surface acoustic wave device. Also, the preferred embodiments of the present invention provide a surface acoustic wave device in which the strength of bonding of a bonding wire is increased without increasing the number of manufacturing steps and which device is low-priced and has improved reliability.

The preferred embodiments of the present invention provide a surface acoustic wave device including a case, a surface acoustic wave element having an electrode, and a bonding wire connected to the electrode. The surface acoustic wave element is fixed to the case via a soft adhesive material and the electrode has a through-hole formed therethrough at a region where the bonding wire is connected thereto.

The surface acoustic wave element preferably has an interdigital electrode connected to the electrode, and the interdigital transducer and the electrode are preferably made of the same material so as to have substantially the same film thickness.

According to preferred embodiments of the present invention, the surface acoustic wave element is fixed to the case member via a soft adhesive material. Therefore, a stress at the time of curing shrinkage of the adhesive is small and, even when an external force or the like is applied to the case member to create a strain, a stress caused by the strain is reduced by the soft adhesive, so that various stresses are not easily transferred to the surface acoustic wave element. Thus, a surface acoustic wave device is provided in which deteriorations in characteristics due to such stresses are substantially eliminated and in which a variation in device characteristics over time cannot easily occur.

While the surface acoustic wave element is fixed preferably via a soft adhesive material, the electrodes to which bonding wires are joined have the above-described through holes. Therefore, when wire bonding is performed by joining the bonding wires to the corresponding electrodes, electrode portions at the edges of the through holes can be easily deformed plastically to break an oxide film which exists on the electrode surface, such that the joining between the bonding wires and the electrodes starts at the point of this breakage of the oxide film. Consequently, the bonding wires can be joined easily and reliably to the corresponding electrodes. That is, the reliability of joining of the bonding wires is significantly improved.

In addition, the interdigital electrodes and the electrodes on the surface acoustic wave element to which the bonding wires are joined are preferably formed of the same material so as to have substantially the same thickness. Therefore, the above-described interdigital electrodes and the electrodes on the surface acoustic wave element to which the bonding wires are joined can be formed by the same process using, for example, a photolithography technique. Therefore, the bonding electrodes having through holes can be formed easily and reliably without performing an extra process step in addition to the normally required process steps for forming the interdigital electrodes. That is, the bonding electrodes to be joined to the bonding wires can be formed easily and reliably without complicating the manufacturing process. Preferably, a plurality of the above-described through holes are formed to allow the joining of the bonding wires to the corresponding electrodes to be performed more reliably and securely.

For the purpose of illustrating the invention, there is shown in the drawings several preferred embodiments and forms which are presently preferred, it being understood, however, that the invention is not limited to the precise arrangements and instrumentalities shown.

BRIEF DESCRIPTION OF THE DRAWINGS

FIGS. 9A to 9E are cross-sectional views corresponding to the portion along the line C—C of FIG. 8 and showing steps of the process for obtaining the electrode structure shown in FIG. 8.

DETAILED DESCRIPTION OF PREFERRED EMBODIMENTS

Hereinafter, preferred embodiments of the present invention are explained in detail with reference to the drawings.

Figure 1A:
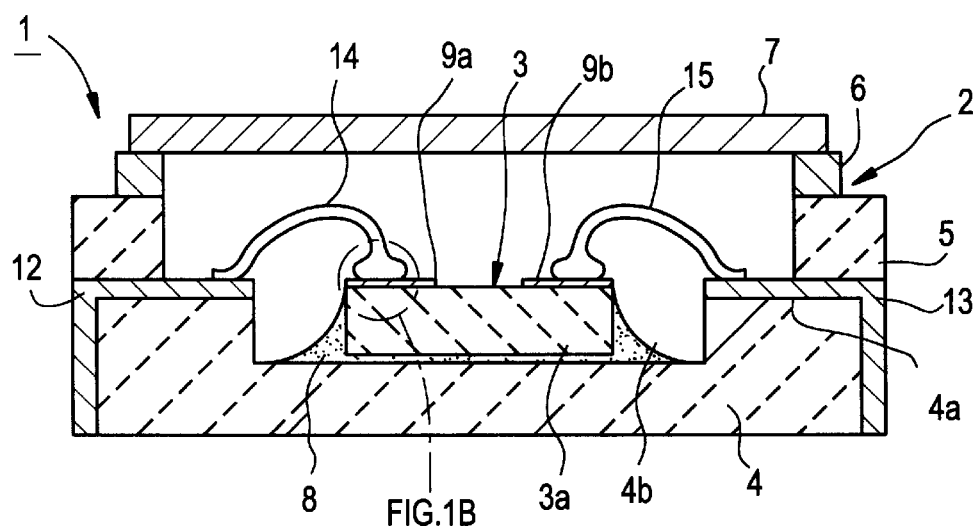
FIG. 1A is a cross-sectional view of a surface acoustic wave device which represents a first preferred embodiment of the present invention.
Figure 1B:
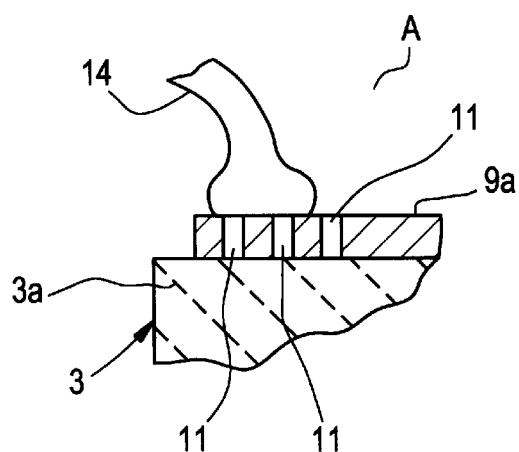
FIG. 1B is a partial enlarged view of an essential portion of the surface acoustic wave device shown in FIG. 1A.

FIG. 1 is a cross-sectional view of a surface acoustic wave device according to a first preferred embodiment of the present invention. A surface acoustic wave device 1 has a structure in which a surface acoustic wave element 3 is provided in a case 2. The case 2 has a stacked structure in which a case member 5, a frame member 6 and a lid member 7 are stacked on a case member 4. A recess 4b is formed in an upper surface 4a of the case member 4 preferably at an approximate center thereof, and the surface acoustic wave element 3 is placed in the recess 4b. The surface acoustic wave element 3 is fixed to the bottom surface of the recess 4b preferably via an adhesive material 8.

One feature of this preferred embodiment is that the adhesive material 8 is a relatively soft adhesive material having a flexibility when the adhesive material is set, e.g., a silicone adhesive, or a denatured epoxy adhesive. More specifically, the soft adhesive material in a cured state has a Shore hardness of about 80 HSD or less defined by JIS (Japanese Industrial Standard) Z2246-1992.

Figure 2:
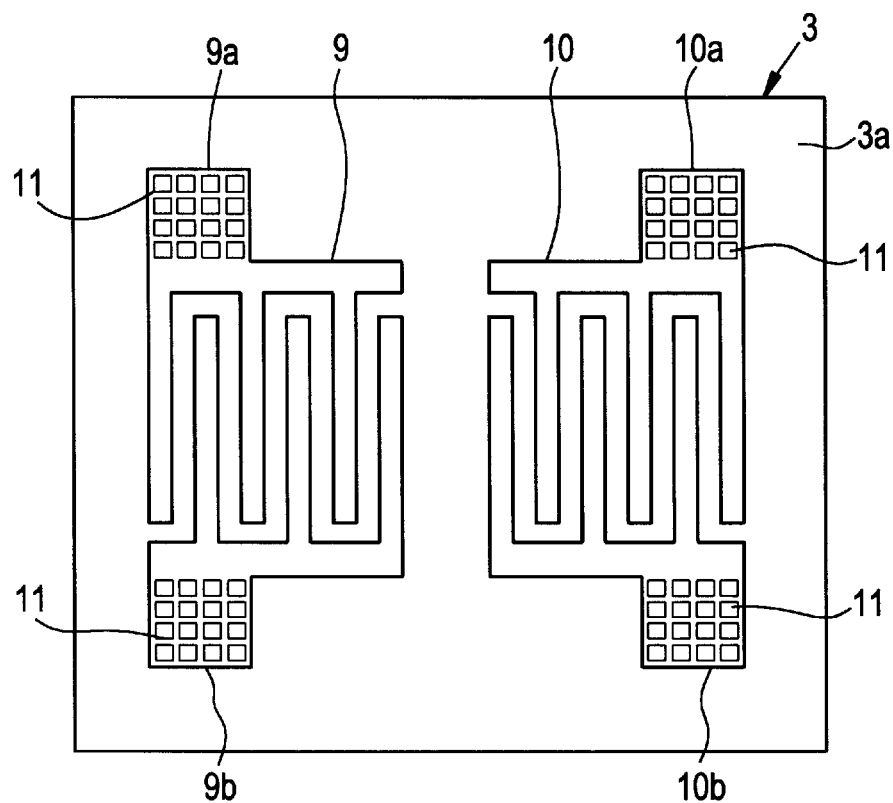
FIG. 2 is a plan view of a surface acoustic wave element used in the surface acoustic wave device shown in FIG. 1A.

The surface acoustic wave element 3 preferably has a structure in which, as shown in the plan view of FIG. 2, an input IDT electrode 9 and an output IDT electrode 10 are located on an upper surface of a surface acoustic wave substrate 3a. Each of the IDT electrodes 9 and 10 preferably includes a pair of comb-shaped electrodes each having at least one electrode finger and being arranged to interdigitate with each other as shown in FIG. 2.

In preferred embodiments of the present invention, the construction and the number of the IDT electrodes in the surface acoustic wave element 3 are not limited to those of the transversal type surface acoustic wave filter comprising the surface acoustic wave element 3 as shown in FIG. 2, and may be modified to form various surface acoustic wave resonators and surface acoustic wave filters as desired.

Bonding electrodes 9a and 9b to which bonding wires are connected are formed at the same time and in a continuous process for forming the comb-shaped electrodes of the IDT electrode 9. Also, on the IDT electrode 10 side of the element 3, bonding electrodes 10a and 10b to which bonding wires are joined are formed at the same time and in a continuous process used to form the comb-shaped electrodes of the IDT 10 electrode.

The bonding electrodes 9a, 9b, 10a, and 10b are provided to respectively form portions to which bonding wires are connected. In this preferred embodiment, the bonding electrodes 9a, 9b, 10a, and 10b are preferably formed of the same material and preferably by the same process as that used to form the IDT electrodes 9 and 10 so that the bonding electrodes 9a, 9b, 10a, 10b have substantially the same film thickness as the IDT electrodes 9 and 10.

Figure 3A:
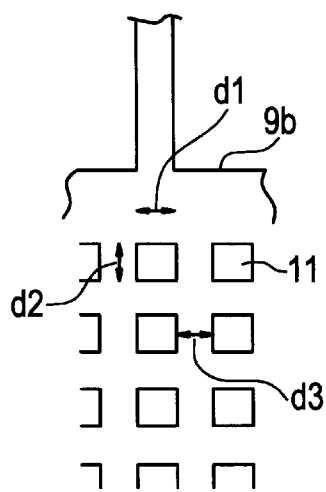
FIGS. 3A and 3B are an enlarged plan view and a crosssectional view of a bonding electrode in the surface acoustic wave device shown in FIG. 2.
Figure 3B:
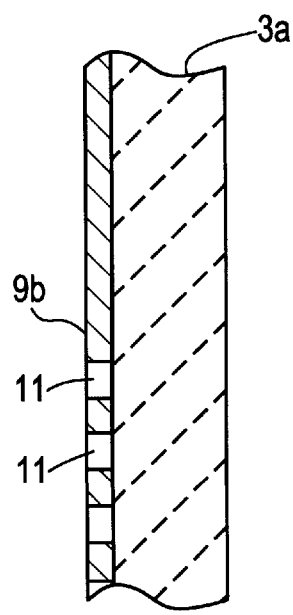

A second feature of the surface acoustic wave device 1 of this preferred embodiment is that each of the above-described bonding electrodes 9a, 9b, 10a, and 10b has a plurality of through holes 11. For example, as shown in FIG. 3A, through holes 11 preferably extend through the bonding electrode 9b to the upper surface of the surface acoustic wave substrate 3a. This same arrangement is also used for the through holes 11 formed in the other bonding electrodes 9a, 10a and 10b.

Figure 4:
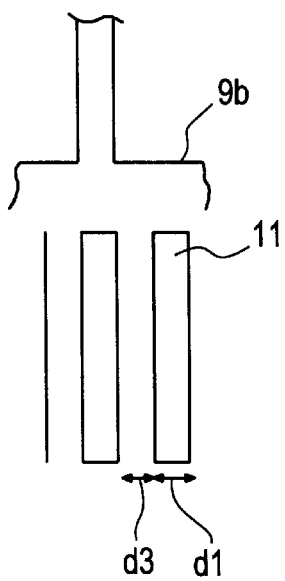
FIG. 4 is a partial enlarged plan view of another example of a surface acoustic wave device according to another preferred embodiment of the present invention.

The through holes 11 shown in FIG. 3A have a substantially rectangular shape although the shape of the through holes 11 may be any shape such as triangular, pentangular, circular or other polygonal shape. As shown in FIG. 4, the through holes 11 may also have a strip shape including an elongated substantially rectangular configuration. The dimension of the through holes 11 is also not limited to a particular length or certain area. However, lengths d1 and d2 of the longitudinal and transversal directions of the through holes 11 are preferably in the range of about 0.2 µm to about 20 µm and the distance d3 between the through holes 11 is preferably in the range of about 0.2 µm to about 20 µm.

Referring back to FIG. 1, in the surface acoustic wave device 1, external electrodes 12 and 13 are located on the upper surface 4a of the case member 4. The external electrodes 12 and 13 are arranged to extend from the upper surface to side surfaces of the case member 4. The external electrodes 12 and 13 can be formed by applying an electroconductive material by a suitable thin-film forming method such as plating, sputtering or vapor deposition, by applying and baking an electroconductive paste, or by other suitable processes.

The external electrodes 12 and 13 are connected to the bonding electrodes 9a and 9b on the surface acoustic wave element 3 preferably via bonding wires 14 and 15. The bonding wires 14 and 15 may be formed of a suitable material used in wire bonding, e.g., Au, Al, Cu or an alloy having such an element as a main constituent. In this preferred embodiment, bonding wires formed of Au are connected to the bonding electrodes 9a and 9b via a ball bonding method.

A bonding method which is different from the above-mentioned ball bonding method, e.g., a wedge bonding method, may alternatively be used.

The case member 5 is preferably formed of a suitable insulating material, e.g., an insulating ceramic such as alumina, or a synthetic resin, and preferably has a substantially rectangular frame-shaped configuration. The frame member 6 stacked on the upper surface of the case member 5 is preferably formed of a suitable material such as a metal, an insulating ceramic or a synthetic resin, and also has a substantially rectangular frame-shaped configuration. The lid member 7 preferably formed of a metal is stacked on the upper surface of the frame member 6. The lid member 7 may also be formed of a synthetic resin or any other material. The above-described case members 4 to 6 are bonded to each other preferably via a suitable adhesive, e.g., an epoxy adhesive.

In the surface acoustic wave device 1 of this preferred embodiment, the surface acoustic wave element 3 is fixed to the case member 4 via a soft adhesive material 8. Since the adhesive 8 is soft, a stress caused in the adhesive material 8 at the time of curing shrinkage is small, so that a stress applied to the surface acoustic wave element 3 is significantly reduced. Even if a strain is caused on the side of the case 2, for example, if an external force is received so that the case member 4 experiences a warp strain, the influence of a stress upon the surface acoustic wave element 3 caused by the strain on the side of the case member 2 is significantly reduced since the stress is absorbed by the adhesive material 8. That is, the stress applied to the surface acoustic wave element 3 is reduced to limit a variation in a characteristic of the surface acoustic wave device 1.

If preferred embodiments of the present invention uses only soft adhesive 8 to fix the surface acoustic wave element 3, there is a risk of occurrence of a reduction in the bonding strength achieved via wire bonding. In this preferred embodiment, however, the bonding strength of the bonding wires can be increased because the lead-out electrodes 9a, 9b, 10a, and 10b have a plurality of through holes 11.

That is, in a wire bonding process using ultrasonic vibration, bonding wires and electrodes are joined to each other by solid phase diffusion. To achieve joining via solid phase diffusion, it is necessary to achieve contact between clean surfaces of the bonding wires and electrode metal.

However, a base metal such as Al is ordinarily used for forming IDT electrodes of surface acoustic wave elements and typically has an oxide film that is formed thereon. Therefore, a process step for breaking the oxide film on the electrode surface is necessary for forming a clean surface to be used in the joining process.

On the other hand, if a soft adhesive material is used for fixation of a surface acoustic wave element, ultrasonic energy applied at the time of wire bonding is absorbed by the soft adhesive. In wire bonding using ultrasonic waves, it is necessary to cause a wire and an electrode to move relative to each other by ultrasonic vibration so that the surfaces to be joined are rubbed together with each other. Such rubbing and relative movement of the metals causes friction, which plastically deforms the metal surfaces, whereby an oxide film is broken so as to expose a clean surface. However, if the adhesive used to fixed the elements of the device in place is soft, synchronization of the device with vibration applied to the wires occurs, resulting in a failure to make the joining surfaces rub together sufficiently strongly.

In contrast, in this preferred embodiment, the above-described bonding electrodes 9a, 9b, 10a, and 10b have a plurality of through holes 11. At the time of bonding, through hole 11 edge portions, i.e., edges between the through holes 11 and the main electrode surface, can be easily deformed plastically so as to break an oxide film, thereby exposing a clean surface. Oxide film breakage and joining are started therefrom to achieve joining. In contrast with the conventional wire bonding which is based on plastically deforming a smooth surface of an electrode, the electrode film at each through hole edge portion has a shape so as to have a low mechanical strength and such that the wire can bite into the through hole to cause a stress in the edge portion thereof, so that plastic deformation can be caused easily by a small vibration energy. The oxide film on the electrode surface is thereby broken to expose a clean surface of the electrode.

Figure 5A:
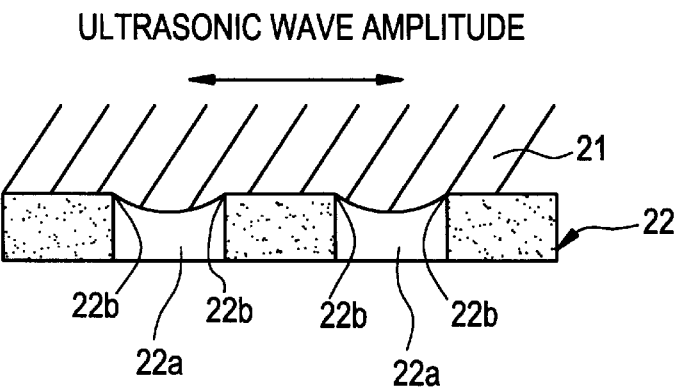
FIGS. 5A and 5B are schematic perspective views showing the steps of the process of bonding wire joining starting from through hole edge portions.
Figure 5B:
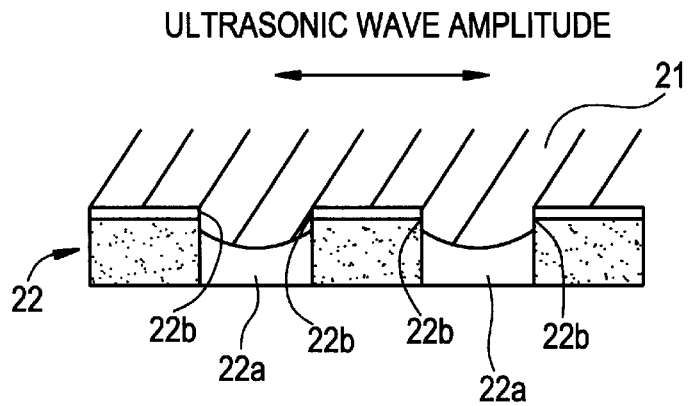

FIGS. 5A and 5B schematically illustrate joining which is caused to start at through hole edge portions. FIG. 5A shows an initial state of joining. A bonding wire 21 rubs on an electrode 22 while biting into through holes 22a. Therefore, electrode portions at edges 22b of the through holes 22a having low mechanical strength are easily deformed so as to break an oxide film on the electrode surface. FIG. 5B shows a latter state of joining. A characteristic of this joining is such that, once a clean surface is exposed by breakage of the oxide film on the electrode, oxidation film breakage progresses from this point. Therefore, oxidation film breakage and joining progress in the ultrasonic wave amplitude direction starting from through hole edge portions 22b.

In this preferred embodiment, the above-described bonding wires 9a to 10b are preferably formed of the same material and preferably via the same process used to form the IDT electrodes 9 and 10. Therefore, bonding electrodes which can be easily and reliably joined to the bonding wires are formed without requiring an additional process step, which will be explained with reference to FIGS. 6 and 7A to 7E.

Figure 6:
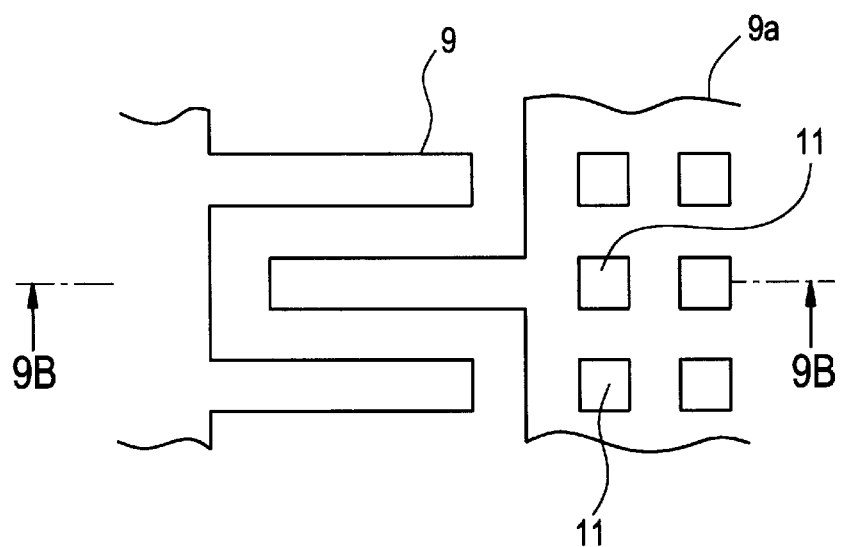
FIG. 6 is a partial enlarged plan view of a portion of the electrodes on the surface acoustic wave element of the surface acoustic wave device shown in FIG. 1A.

FIG. 6 is an enlarged plan view of a portion where the above-described bonding electrode 9a and the IDT electrode 9 are formed. FIGS. 7A to 7E are cross-sectional views of the process of forming the IDT electrode 9 and the bonding electrode 9a. FIGS. 7A to 7E correspond to the section along the line B—B of FIG. 6.

Figure 7A:
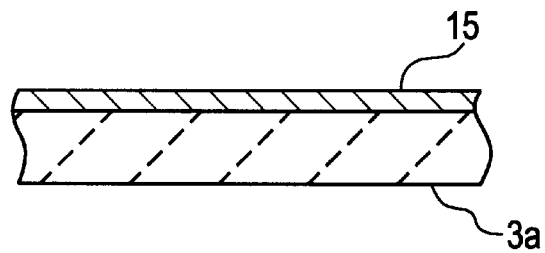
FIGS. 7A to 7E are cross-sectional views corresponding to the portion along the line B—B of FIG. 6 and showing steps of the process for obtaining the electrode structure shown in FIG. 6.
Figure 7B:
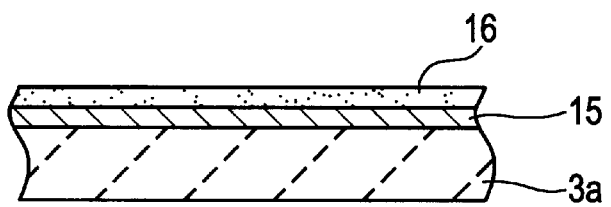

As shown in FIG. 7A, an electroconductive film 15 is preferably provided on the entire upper surface of the surface acoustic wave substrate 3a. The electroconductive film 15 is preferably formed by disposing Al on the entire upper surface of the substrate 3a via a thin film forming method such as vapor deposition or plating. Next, a photoresist 16 is applied to the entire upper surface of the electroconductive film 15 (FIG. 7B).

Figure 7C:
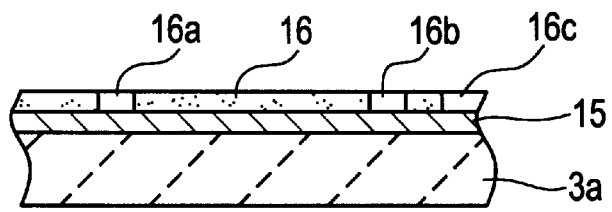

Thereafter, a mask is placed on the upper surface of the photoresist 16 and an exposure step is performed to leave a portion at which the IDT electrode 9 will be formed, a portion at which the bonding electrode 9a will be formed and portions other than those corresponding to regions in which through holes will be formed. The other portions of the photoresist 16, i.e., the portions other than those corresponding to the electrodes and the portions at which through holes 11 will be formed, are removed by exposure and development. By performing the process as described above, through holes 16a, 16b, and 16c are formed in the portions at which through holes will finally be formed and in the portions other than those corresponding to the regions in which the IDT electrode 9 and the bonding electrode 9a will be formed. Referring to FIG. 7C, a through hole 16a corresponds to a region outside the region of the IDT electrode 9, and through holes 16b and 16c correspond to portions at which through holes 11 will finally be formed.

Figure 7D:
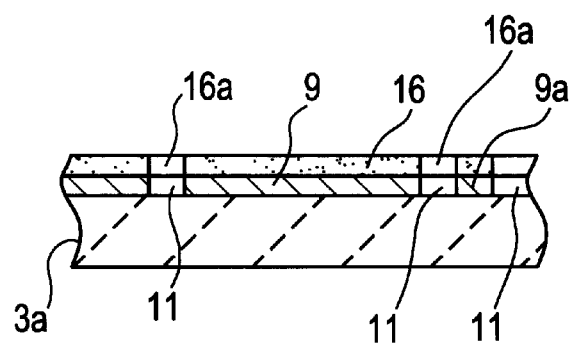

Next, etching is performed by using an etchant which can etch the electroconductive film 15 but does not corrode the photoresist 16. Electroconductive film portions below through holes 16a to 16c are thereby removed to form the IDT electrode 9 and the bonding electrode 9a along with through holes 11 in the bonding electrode 9a, as shown in FIG. 7D.

Figure 7E:
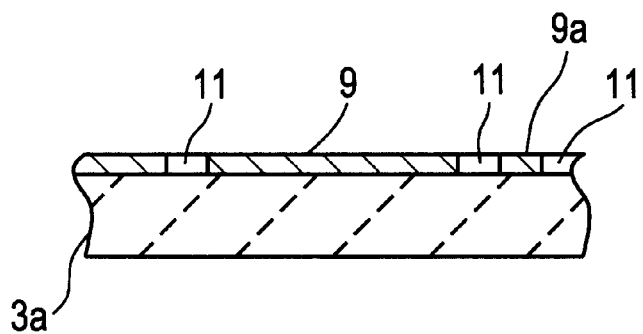

Finally, as shown in FIG. 7E, the photoresist 16 is removed to obtain the electrode structure shown in FIG. 6.

As is apparent from the above description of the manufacturing method with reference to FIGS. 6 and 7A to 7E, the bonding electrode 9a having a plurality of through holes 11 can be formed simultaneously during the process of forming the IDT electrode 9. Therefore, a connection which is made using a bonding wire can be easily achieved and bonding electrodes 9a to 10b having improved joining reliability can be easily formed without increasing the number of process steps.

Since in the above-described method, the bonding electrode 9a is formed via the same process and using the same material used to form the IDT electrode 9, the bonding electrode 9a preferably has substantially the same film thickness as the IDT electrode 9. In other words, if the bonding electrode 9a is formed of the same material as the IDT electrode 9 so as to have substantially the same film thickness as the IDT electrode 9, a bonding electrode 9a and the IDT electrode 9 can be formed via the same process, as shown in FIGS. 6 and 7A to 7E.

Figure 8:
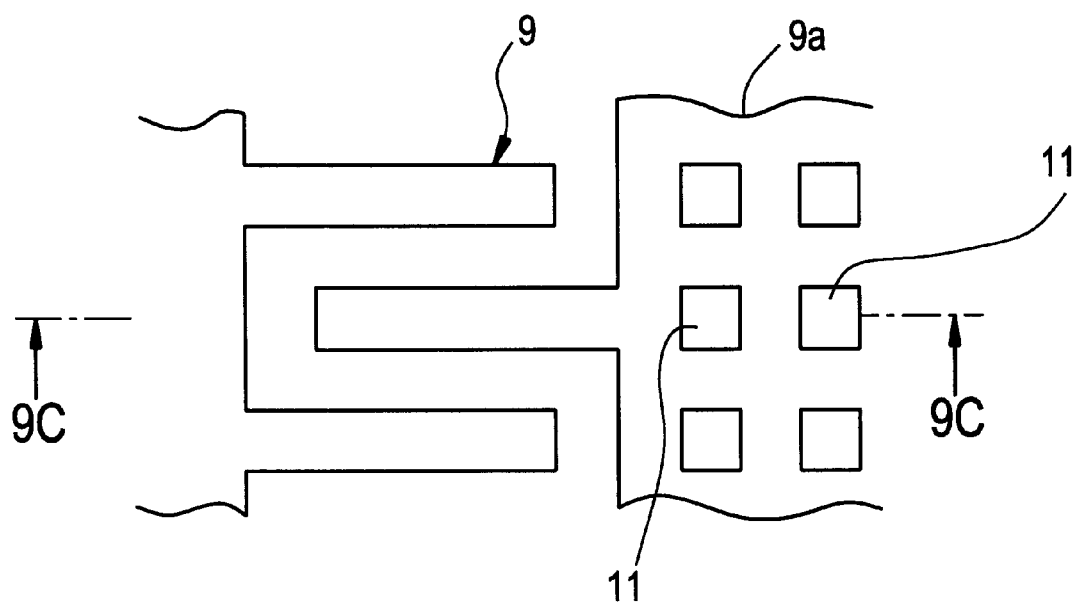
FIG. 8 is a partial enlarged plan view of a portion of the electrodes on the surface acoustic wave element of the surface acoustic wave device shown in FIG. 1.

FIGS. 8 and 9A to 9D are diagrams for explaining another example of the method of forming an IDT electrode 9 and a bonding electrode 9a. FIG. 8 is a plan view of a portion in which an IDT electrode 9 and a bonding electrode 9a are provided. FIGS. 9A to 9D are partially cut-out sectional views of steps in the process of forming the electrodes, corresponding to the section along the line C—C of FIG. 8.

Figure 9A:
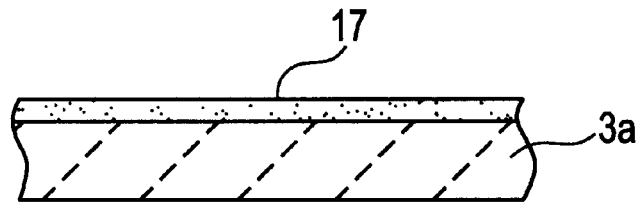
Figure 9B:
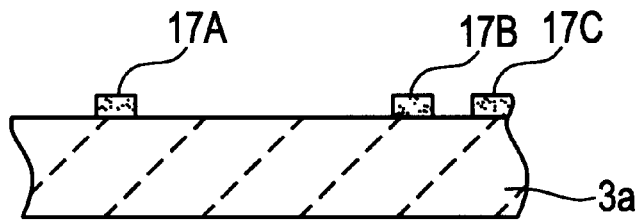

In this method, as shown in FIG. 9A, a photoresist 17 is applied to the entire upper surface of the surface acoustic wave substrate 3a. Next, exposure and development of the photoresist 17 are performed to leave photoresist members 17A to 17C only in regions at which no portions of the IDT electrode 9 and the bonding electrode 9a will be located while removing the remaining photoresist portions corresponding to other regions. A photoresist member 17A is located in the region where no portions of the IDT electrode 9 and the bonding electrode 9a will be formed while photoresist members 17B and 17C are located at positions where the through holes 11 will be formed.

Figure 9C:
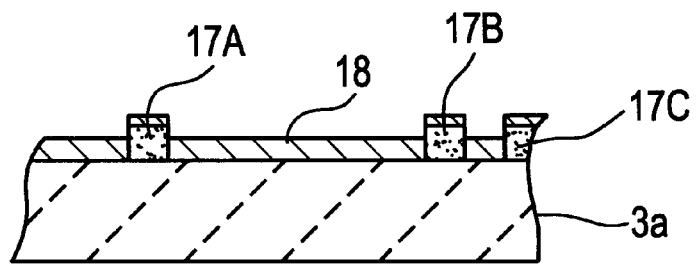

Next, as shown in FIG. 9C, an electroconductive film 18 of Al is formed on the entire surface of the substrate 3a. In this case, the electroconductive film 18 is formed on the upper surface of the surface acoustic wave substrate 3a and the upper surfaces of the remaining photoresist members 17A to 17C.

Figure 9D:
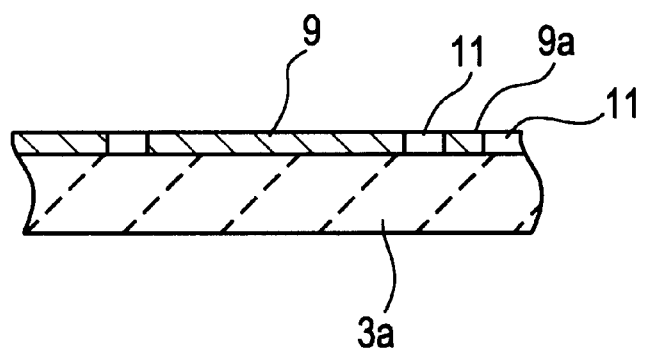
Figure 10:
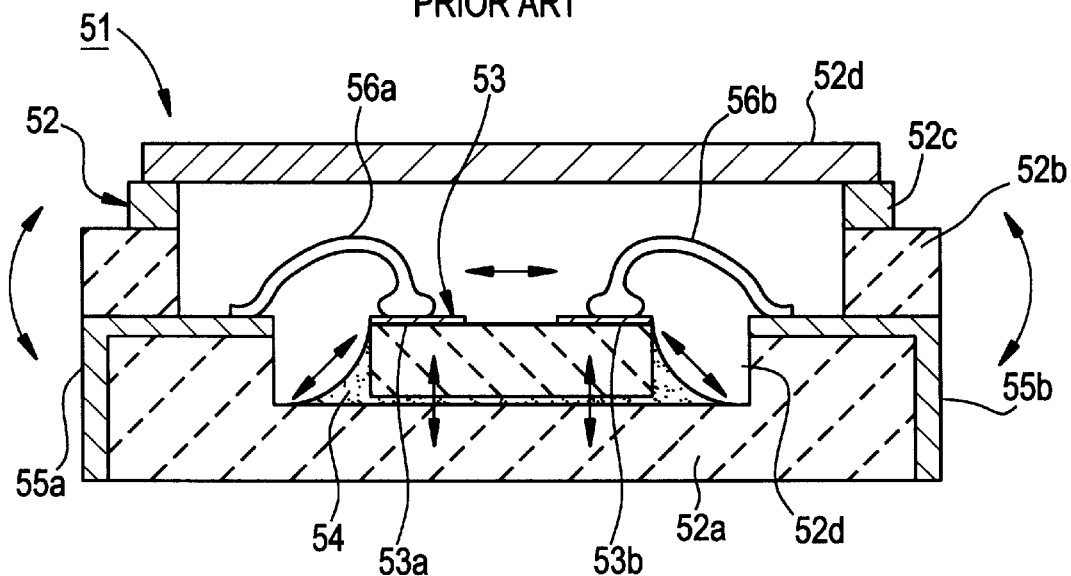
FIG. 10 is a cross-sectional view of an example of a conventional surface acoustic wave device.
Figure 11:
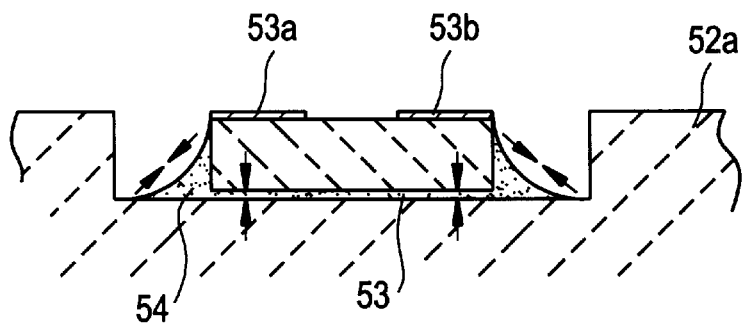
FIG. 11 is a partial cross-sectional view for explaining directions of stresses caused by curing shrinkage of an adhesive at the time of assembly of the surface acoustic wave device shown in FIG. 10.
Figure 12:
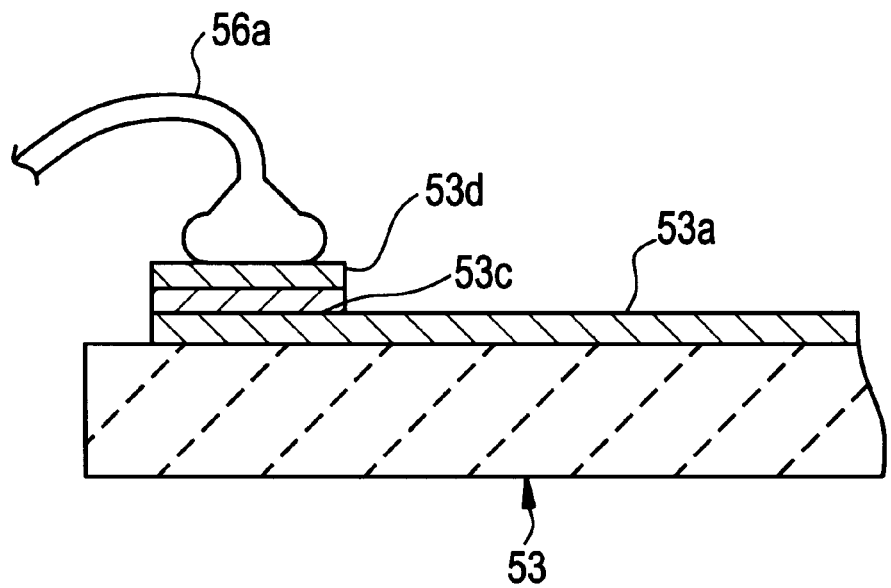
FIG. 12 is a partial sectional view for explaining a conventional joining structure for improving the reliability of joining using bonding wires.
Figure 13:
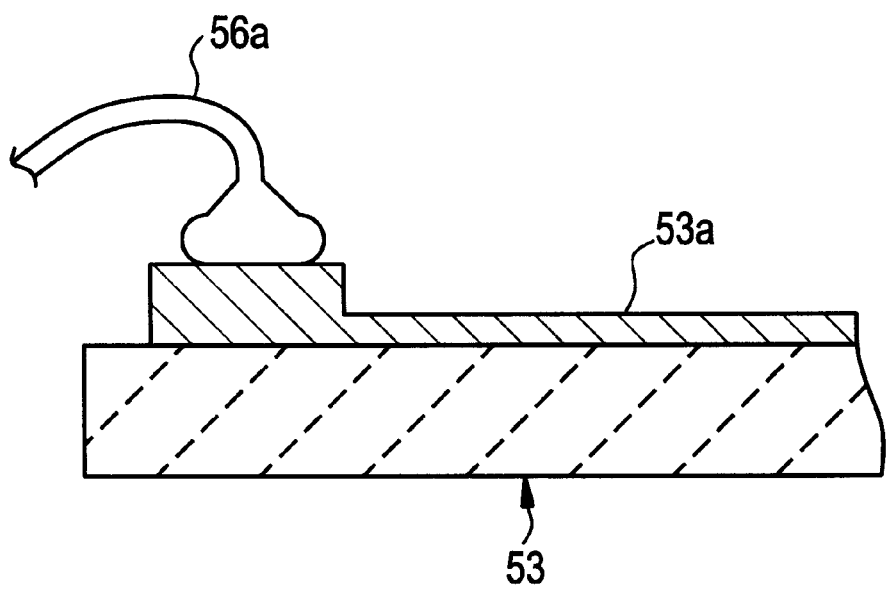
FIG. 13 is a partial sectional view for explaining another conventional joining structure for improving the reliability of joining using bonding wires.

Photoresist members 17A to 17C having the electroconductive film formed on the upper surfaces thereof are removed. The electrode structure shown in FIG. 7 is thereby formed on surface acoustic wave substrate 3a, as shown in FIG. 9D.

In the method described above with reference to FIGS. 8 and 9A to 9D, the IDT electrode 9 and the bonding electrode 9a can also be formed of the same material and by the same process so that the bonding electrodes having an improved ability to reliably and easily be joined with bonding wires can be formed easily and reliably without increasing the number of process steps.

While in the surface acoustic wave device 1 shown in FIG. 1, the case 2 is formed by stacking the case members 4 to 6 and the lid member 7 on one another, the material forming the case 2 and the structure of the case are not limited to those of the case 2 illustrated in FIG. 1. For example, a case formed by joining a metallic cap on an insulating substrate may be used.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
   a case;
   a surface acoustic wave element provided in the case and having at least one bonding electrode; and
   at least one bonding wire connected to the at least one bonding electrode; wherein
   the at least one bonding electrode has at least one through hole extending therethrough at a region where the at least one bonding wire is connected to the at least one bonding electrode.

2. A surface acoustic wave device according to claim 1, further comprising an adhesive material, wherein the surface acoustic wave element is fixed to the case via the adhesive material.

3. A surface acoustic wave device according to claim 2, wherein the adhesive material is one of a silicone adhesive material and a denatured epoxy adhesive material.

4. A surface acoustic wave device according to claim 2, wherein the adhesive material when cured has a Shore hardness of about 80 HDS or less.

5. A surface acoustic wave device according to claim 1, wherein the surface acoustic wave element has an interdigital electrode connected to the at least one bonding electrode, and the interdigital electrode and the at least one bonding electrode are made of the same material and have substantially the same film thickness.

6. A surface acoustic wave device according to claim 1, wherein the at least one bonding electrode has a plurality of through holes extending therethrough.

7. A surface acoustic wave device according to claim 6, wherein the plurality of through holes have a shape that is substantially rectangular.

8. A surface acoustic wave device according to claim 1, wherein the at least one bonding electrode has a plurality of through holes extending therethrough, and the at least one bonding wire is connected to at least one bonding electrode at a region where the plurality of through holes are provided.

9. A surface acoustic wave device comprising:

a surface acoustic wave element having a surface acoustic wave substrate, an interdigital transducer and at least one bonding electrode connected to the interdigital transducer, the interdigital transducer and the at least one bonding electrode being provided on the surface acoustic wave substrate;

a case having a recess for holding the surface acoustic wave element, the case having an external electrode;

a cured adhesive material provided between a bottom of the recess of the case and the surface acoustic wave substrate of the surface acoustic wave element such that the surface acoustic wave element is fixed in the recess of the case via the cured adhesive material, the cured adhesive material being one of a silicone adhesive material and a denatured epoxy adhesive material; and at least one bonding wire connected between the external electrode and the at least one bonding electrode of the surface acoustic wave element.

10. A surface acoustic wave device according to claim 9, wherein the at least one bonding electrode has at least one through hole extending therethrough at a region where the at least one bonding wire is connected to the at least one bonding electrode.

11. A surface acoustic wave device according to claim 9, wherein the cured adhesive material has a Shore hardness of about 80 HDS or less.

12. A surface acoustic wave device according to claim 9, wherein the at least one bonding electrode has a plurality of through holes extending therethrough and the at least one bonding wire is connected to the at least one bonding electrode at a region where the plurality of through holes are provided.

13. A surface acoustic wave device according to claim 12, wherein the plurality of through holes have a shape that is substantially rectangular.

14. A surface acoustic wave device according to claim 9, wherein the interdigital transducer and the at least one bonding electrode are formed of the same material and have substantially the same thickness.

* * * * *